(12) United States Patent
Akhtar et al.

(10) Patent No.: US 8,663,380 B2
(45) Date of Patent: Mar. 4, 2014

(54) GAS PHASE PRODUCTION OF COATED TITANIA

(75) Inventors: M. Kamal Akhtar, Ellicott City, MD (US); Sotiris Emmanuel Pratsinis, Zurich (CH); Martin Christian Heine, Seuzach (CH); Alexandra Teleki Harsanyi, Zurich (CH); Reto Strobel, Zurich (CH)

(73) Assignee: Cristal USA Inc., Hunt Valley, MD (US)

( * ) Notice: Subject to any disclaimer, the term of this patent is extended or adjusted under 35 U.S.C. 154(b) by 1053 days.

(21) Appl. No.: 11/941,640

(22) Filed: Nov. 16, 2007

(65) Prior Publication Data

US 2009/0126604 A1    May 21, 2009

(51) Int. Cl.
*C09C 1/36* (2006.01)
*C23C 4/10* (2006.01)

(52) U.S. Cl.
USPC ............................ 106/436; 106/442; 427/453

(58) Field of Classification Search
USPC .................. 106/436, 438, 441–442; 427/453
See application file for complete search history.

(56) References Cited

U.S. PATENT DOCUMENTS

| | | | |
|---|---|---|---|
| 3,552,995 A | 1/1971 | Powell | |
| 4,317,778 A | 3/1982 | Blum et al. | |
| 4,351,773 A | 9/1982 | Milberger et al. | |
| 4,374,043 A | 2/1983 | Blum et al. | |
| 5,562,764 A * | 10/1996 | Gonzalez | 106/437 |
| 5,922,120 A | 7/1999 | Subramanian et al. | |
| 5,958,361 A | 9/1999 | Laine et al. | |
| 6,235,270 B1 * | 5/2001 | Ishii et al. | 424/59 |
| 6,328,944 B1 | 12/2001 | Mangold et al. | |
| 6,420,437 B1 | 7/2002 | Mori et al. | |
| 6,544,493 B1 * | 4/2003 | Tanaka et al. | 423/613 |
| 6,562,314 B2 | 5/2003 | Akhtar et al. | |
| 6,627,336 B1 | 9/2003 | Ohmori et al. | |
| 6,737,485 B1 | 5/2004 | St. Clair et al. | |
| 6,824,826 B1 | 11/2004 | Amadelli et al. | |
| 6,852,306 B2 | 2/2005 | Subramanian et al. | |
| 7,029,648 B2 | 4/2006 | Subramanian et al. | |
| 7,083,769 B2 | 8/2006 | Moerters et al. | |
| 7,700,152 B2 | 4/2010 | Laine et al. | |
| 8,182,573 B2 | 5/2012 | Stark et al. | |

(Continued)

FOREIGN PATENT DOCUMENTS

EP    1042408    5/2009
WO    WO 96/36441    11/1996

(Continued)

OTHER PUBLICATIONS

Akhtar, M. K., S. E. Pratsinis, and S. V. R. Mastrangelo, "Dopants in vapor-phase synthesis of titania powders," *J. Am. Ceram. Soc.* 75, 3408 (1992).

(Continued)

*Primary Examiner* — Pegah Parvini
(74) *Attorney, Agent, or Firm* — Dunlap Codding, P.C.

(57) ABSTRACT

A flame spray pyrolysis process for the preparation of ultrafine titania particles coated with a smooth, homogeneous coating of one or more metal oxides is provided. The metal oxide coating is achieved by contacting the titania particles with a metal oxide precursor downstream of the titania formation zone, after the titania particles have formed. The process provides titania particles with a high rutile content and a smooth and homogeneous coating of a metal oxide.

27 Claims, 7 Drawing Sheets

(56) References Cited

U.S. PATENT DOCUMENTS

| | | | |
|---|---|---|---|
| 2001/0041217 A1 | 11/2001 | Sanjurjo et al. | |
| 2003/0128428 A1* | 7/2003 | Anderson et al. | 359/534 |
| 2003/0143421 A1 | 7/2003 | Price et al. | |
| 2004/0241502 A1 | 12/2004 | Chung et al. | |
| 2005/0227864 A1* | 10/2005 | Sutorik et al. | 502/304 |
| 2007/0175364 A1* | 8/2007 | Blumel et al. | 106/446 |

FOREIGN PATENT DOCUMENTS

| | | | |
|---|---|---|---|
| WO | WO 2003/070640 | 8/2003 | |
| WO | WO 2006/116887 | * 11/2006 | C08K 9/00 |
| WO | WO2007/028267 | 3/2007 | |

OTHER PUBLICATIONS

Akhtar, M. K., S. E. Pratsinis, and S. V. R. Mastrangelo, "Vapor-phase synthesis of Al-doped titania powders," *J. Mater. Res.* 9, 1241 (1994).

Allen, N. S., H. Khatami, and F. Thompson, "Influence of titanium-dioxide pigments on the thermal and photochemical oxidation of low-density polyethylene film," *Eur. Polym. J.* 28, 817, 1991.

Allen, N. S., M. Edge, G. Sandoval, J. Verran, J. Stratton, and J. Maltby, "Photocatalytmonthic coatings for environmental applications," *Photochem. Photobiol.* 81, 279 (2005).

Braun, J. H., "Titanium dioxide—A review," *J. Coat. Technol.* 69, 59 (1997).

Carotenuto, G., Y. S. Her, and E. Matijevic, "Preparation and characterization of nanocomposite thin films for optical devices," *Ind. Eng. Chem. Res.* 35, 2929 (1996).

Caseri, W. R., "Nanocomposites of polymers and inorganic particles: preparation, structure and properties," *Mater. Sci. Technol.* 22, 807 (2006).

Cheary, R. W., and A. A. Coelho, "Axial divergence in a conventional X-ray powder diffractometer. I. Theoretical foundations," *J. Appl. Crystallogr.* 31, 851 (1998).

Christensen, P. A., A. Dilks, T. A. Egerton, and J. Temperley, "Infrared spectroscopic evaluation of the photodegradation of paint—Part II: The effect of UV intensity & wavelength on the degradation of acrylic films pigmented with titanium dioxide," *J. Mater. Sci.* 35, 5353 (2000).

Egerton, T. A., "The modification of fine powders by inorganic coatings," *KONA* 16, 46 (1998).

El-Toni, A. M., S. Yin, and T. Sato, "Control of silica shell thickness and microporosity of titania-silica core-shell type nanoparticles to depress the photocatalytic activity of titania," *J. Colloid Interface Sci.* 300, 123 (2006).

Hung, C. H., and J. L. Katz, "Formation of mixed-oxide powders in flames 1. $TiO_2$-$5iO_2$," *J. Mater. Res.* 7, 1861 (1992).

Kodas, T. T., Q. H. Powell, and B. Anderson, *Coating of $TiO_2$ pigment by gas phase and surface reactions*, International patent, WO 96/36441 (1996).

Kyprianidou-Leodidou, T., P. Margraf, W. Caseri, U. W. Suter, and P. Walther, "Polymer sheets with a thin nanocomposite layer acting as a UV filter," *Polym. Adv. Technol.* 8, 505 (1997).

Lee, S. K., K. W. Chung, and S. G. Kim, "Preparation of various composite $TiO_2$/$SiO_2$ ultrafine particles by vapor-phase hydrolysis," *Aerosol Sci. Technol.* 36, 763 (2002).

Madler, L., H. K. Kammler, R. Mueller, and S. E. Pratsinis, "Controlled synthesis of nanostructured particles by flame spray pyrolysis," *J. Aerosol Sci.* 33, 369 (2002).

Madler, L., W. J. Stark, and S. E. Pratsinis, "Simultaneous deposition of Au nanoparticles during flame synthesis of $TiO_2$ and $SiO_2$," *J. Mater. Res.* 18, 115 (2003).

Mezey, E. J., "Pigments and Reinforcing Agents" in Vapor Deposition, eds. C. F. Powell, J. H. oxley and J. M. Blocher Jr., John Wiley & sons, New York (1966).

Nussbaumer, R. J., W. R. Caseri, P. Smith, and T. Tervoort, "Polymer-$TiO_2$ nanocomposites: A route towards visually transparent broadband UV filters and high refractive index materials," *Macromol. Mater. Eng.* 288, 44 (2003).

Powell, Q. H., G. P. Fotou, T. T. Kodas, B. M. Anderson, and Y. X. Guo, "Gas-phase coatin of $TiO_2$ with $SiO_2$ in a continuous flow hot-wall aerosol reactor," *J. Mater. Res.* 12, 552 (1997).

Schulz, H., L. Madler, R. Strobel, R. Jossen, S. E. Pratsinis, and T. Johannessen, "Independent control of metal cluster and ceramic particle characteristics during one-step synthesis of Pt/$TiO_2$," *J. Mater. Res.* 20, 2568 (2005).

Song, G. K. C., and S. E. Pratsinis, "Synthesis of bimodally porous titania powders by hydrolysis of titanium tetraisopropoxide," *J. Mater. Res.* 15, 2322 (2000).

Teleki, A., S. E. Pratsinis, K. Kalyanasundaram, and P. I. Gouma, "Sensing of organic vapors by flame-made $TiO_2$ nanoparticles," *Sens. Actuators, B, Chem* 119, 683 (2006).

Teleki, A., S. E. Pratsinis, K. Wegner, R. Jossen, and F. Krumeich, "Flame-coating of titania particles with silica," *J. Mater. Res.* 20, 1336 (2005).

Vemury, S., and S. E. Pratsinis, "Dopants in flame synthesis of titania," *J. Am. Ceram. Soc.* 78, 2984 (1995).

Wegner, K., and S. E. Pratsinis, "Nozzle-quenching process for controlled flame synthesis of titania nanoparticles," *AIChE J.* 49, 1667 (2003).

Fotou, George P. et al., "Coating Titania Aerosol Particles with $ZrO_2$, $Al_2O_3$/$ZrO_2$, and $SiO_2$/$ZrO_2$ in a Gas-Phase Process," Aerosol Science and Technology 33:557-571, 2000, American Associate for Aerosol Research Published by Taylor and Francis.

Swihart, Mark T., "Vapor-phase synthesis of nanoparticles " Current Opinion in Colloid and Interface Science 8, 2003, pp. 127-133.

PCT/US08/80799, International Search Report and Written Opinion, Dec. 24, 2008.

Ortega et al., "Control of Particle Morphology During Multicomponent Metal Oxide Powder Generation by Spray Pyrolysis" *J. Aerosol Sci.*, vol. 23, Suppl. 1, (1992) pp. S253-S256.

Strobel et al., "Flame Aerosol Synthesis of Smart Nanostructured Materials" *J. Mater. Chem.*, vol. 17, (2007) pp. 4743-4756.

Song, Shin Ae, and Park, Seung Bin, "Synthesis of Silica-Coated Ceria Particles for STI-CMP in a Single Step by Flame Spray Pyrolysis with an Emulsion" *Journal of the Electrochemical Society*, (2011) vol. 158, Issue 8, pp. K170-K174. (abstract).

* cited by examiner

GAS PHASE PRODUCTION OF COATED TITANIA

FIELD OF THE INVENTION

This invention relates to a high temperature gas-phase process for the production of ultrafine titania particles coated with a homogeneous metal oxide layer.

BACKGROUND OF THE INVENTION

Titania particles possess an attractive combination of optical properties such as absorption of ultraviolet light and a very high refractive index. Polymer composites comprising inorganic nanoparticles are attractive for a range of optical applications (Carotenuto et al., 1996). Undesired light scattering (Beecroft and Ober, 1997) is significantly reduced in nanocomposites compared to composites containing larger particles (>50 nm; Kyprianidou-Leodidou et al., 1997) if the refractive indices of polymer and particles differ and if the primary particles are randomly distributed in the polymer matrix. These nanocomposites will often appear transparent (Caseri, 2006). Rutile $TiO_2$-based nanocomposites can be used as UV filters, coatings for UV-sensitive materials and lenses as the particles absorb UV light, are transparent at the visible wavelengths and possess a high refractive index (Nussbaumer et al., 2003). The anatase phase is less suited for these applications as its absorption edge is located at lower wavelengths (Christensen et al., 2000) and generally has a higher photocatalytic activity which can lead to degradation of the polymer matrix (Allen et al., 1992).

A significant amount of the world's annual production of titania is produced by the gas phase oxidation of titanium tetrachloride using a pyrolysis process. In flame synthesis of titania, an industrial process for the production of pigmentary titania (Braun, 1997), typically the anatase phase is formed under oxygen-rich conditions at atmospheric pressure (Wegner and Pratsinis, 2003). Rutile can be synthesized by thermal treatment of anatase titania (Song and Pratsinis, 2000), however this also leads to grain growth and agglomeration. The larger particles or agglomerates significantly scatter light (Beecroft and Ober, 1997) resulting in opaque composites (Nussbaumer et al., 2003; Caseri, 2006). Rutile formation during synthesis of titania nanoparticles can be promoted by co-oxidation with aluminum precursors (Mezey et al., 1966) as has been shown in hot-wall (Akhtar et al. 1994) and diffusion flame (Vemury and Pratsinis 1995) aerosol reactors.

The titania particle surface can be passivated by coatings, in order to prevent the phototcatalytic decomposition of the polymer matrix (El-Toni et al., 2006). Coatings can reduce the generation of free radicals by physically inhibiting oxygen diffusion, preventing the release of free radicals and providing hole-electron or hydroxyl-radical recombination sites (Allen et al., 2005). Furthermore, coatings can also improve wetting and dispersion properties of the particles in an organic matrix (Egerton, 1998; Allen et al., 2005). Coatings are typically applied to pigmentary titania in a post-synthesis, wet-phase treatment by precipitation of nano-sized hydrous oxides of Al, Zr, Sn or Si onto the titania surface (Iler, 1959). Silica coating of titania is particularly attractive because this coating yields maximum durability of the coated material. However, this is also accompanied by loss of opacity as a result of agglomeration during wet-phase treatment. Wet dispersion of the starting powder, filtration, washing and drying add to production time and cost. Furthermore, the control of the coating morphology is difficult in the wet precipitation process. Rough and porous coatings are often obtained where complete and homogeneous coatings are desired for optimum durability and a maximum reduction of photoactivity of the titania.

In-situ gas-phase processes have been investigated as alternative coating routes either in aerosol flow (Piccolo et al., 1977) or flame reactors (Hung and Katz, 1992). In flame reactors $SiO_2$ coated $TiO_2$ can be formed by co-oxidation of silicon and titanium precursors (Hung and Katz, 1992; Teleki et al., 2005). The product powder morphology is a result of simultaneous growth of the two oxides in the flame and can be controlled by precursor concentration and flame temperature (Hung and Katz, 1992). In a diffusion flame rapid cooling of particle growth by nozzle quenching (Wegner and Pratsinis, 2003) facilitated the formation of smooth silica coatings while in the unquenched flame mainly particles segregated in silica and titania were formed (Teleki et al., 2005). In aerosol flow reactors coating precursors can be added downstream a $TiO_2$ particle formation zone to produce oxide coatings on the titania nanoparticles (Kodas et al., 1996; Powell et al., 1997). The key process parameters controlling coating morphology are temperature and coating precursor concentration (Powell et al., 1997) as well as the mixing mode of titania particles and coating precursor (Lee et al., 2002).

U.S. Pat. No. 5,562,764 to Gonzalez describes a process for producing substantially anatase-free $TiO_2$ by addition of a silicon halide to the reaction product of $TiCl_4$ and an oxygen containing gas in a plug flow reactor. The silicon halide is added downstream of where the $TiCl_4$ and oxygen gas are reacted. The patent describes a process to produce pigmentary grade $TiO_2$, and the $SiCl_4$ is added to the process at a temperature of about 1200° C. to about 1600° C., and a pressure of 5-100 psig.

International Application Publication No. WO 96/36441 to Kemira Pigments, Inc. describes a process for making pigment grade $TiO_2$ coated with a metal oxide in a tubular flow reactor. The metal oxide precursor is introduced downstream of the $TiO_2$ formation zone. The publication discloses that the temperature for treating $TiO_2$ with a silica precursor must be sufficiently high to ensure that the precursor forms $SiO_2$. The publication discloses that for coating $TiO_2$ with $SiO_2$ using $SiCl_4$, the temperature must be greater than 1300° C. The particles produced by the process are pigment grade.

U.S. Pat. No. 6,562,314 to Akhtar et al., describes a process for the production of substantially anatase-free $TiO_2$ by introducing a silicon compound into the $TiCl_4$ stream to form an admixture before the reaction with oxygen. The process is conducted under pressure and the titania is not coated with silica.

U.S. Pat. Nos. 6,852,306 and 7,029,648 to Subramanian et al., describe a process to produce $TiO_2$ pigment particles coated with silica in a tubular flow reactor. The $TiCl_4$ is introduced downstream of the $TiO_2$ formation zone at a temperature of no greater than 1200° C. The coating produced by this about 1 to 4 nm thick and is a mixture of amorphous aluminum oxide and amorphous silicon dioxide. Only silicon halides are used as the metal oxide precursor.

U.S. Pat. No. 7,083,769 to Moerters et al., describes silicon-titanium mixed oxide powders prepared by a flame hydrolysis process. The process described comprises introducing streams of $TiCl_4$ and a silica precursor into the burner at the same time. The mixed oxide produced is disclosed to be an intimate mixture of titanium dioxide and silicon dioxide on an atomic level with the formation of Si—O—Ti bonds. The surface of the particles is disclosed to be enriched with silicon.

U.S. Pat. No. 6,328,944 to Mangold et al., describes doped metal oxides or non-metal oxides prepared by a process which comprises feeding aerosols into the flame of a pyrogenic reactor. $SiCl_4$ is fed into a combustion chamber via one feed tube and an aerosol which comprises a second metal oxide dopant is fed to the combustion chamber separately through another tube. The $SiCl_4$ and the dopant aerosol are mixed together prior to reaching the combustion chamber.

Although these gas-phase coating techniques offer promise in obtaining metal oxide coated titania particles with desired characteristics, the production of titania nanoparticles with smooth homogeneous metal oxide coatings remains a challenge. Therefore, there remains a need for a pyrolysis process that produces high rutile content titanium dioxide nanoparticles that are coated with a smooth and homogeneous coating of a second metal oxide layer.

SUMMARY OF THE INVENTION

Provided is a process for the preparation of ultrafine titanium dioxide particles comprising a smooth homogeneous coating of one or more metal oxides on the surface of the titanium oxide particles comprising:
  (a) reacting a $TiO_2$ precursor with oxygen in a gas phase oxidation reactor to produce ultrafine $TiO_2$ particles;
  (b) contacting the ultrafine $TiO_2$ particles with a metal oxide precursor downstream of the reaction zone of the pyrolysis reactor to form coated ultrafine titanium dioxide particles with a smooth, homogeneous metal oxide coating; and
  (c) isolating the coated ultrafine titanium dioxide particles.

In one embodiment, the reactor is a pyrolysis reactor. In another embodiment, the reactor is a flame spray pyrolysis reactor.

In one embodiment, the $TiO_2$ precursor is $TiCl_4$ or titanium tetraisopropoxide. In one embodiment of the invention, the coated ultrafine titanium dioxide particles are at least 95% by weight in the rutile form. In another embodiment, the ultrafine titanium dioxide particles comprise aluminum oxide as a dopant.

In one embodiment, the particle size of the titanium dioxide particles is between about 15 nm to about 100 nm. In another embodiment, the particle size is between about 15 nm to about 60 nm. In another embodiment the specific surface area of the particles is between about 15 $m^2/g$ to about 100 $m^2/g$.

In one aspect of the invention, the metal oxide coating of the invention may comprise a metal oxide selected from the group consisting of $SiO_2$, $Al_2O_3$, $B_2O_3$, $ZrO_2$, $GeO_2$, $WO_3$, $Nb_2O_5$, $MgO$, $ZnO$ and $SnO_2$.

In a particular embodiment, the metal oxide coating comprises $SiO_2$. In another particular embodiment of the invention, the metal oxide coating comprises $Al_2O_3$.

The metal oxide precursor may be introduced using variety of methods. In one embodiment, the metal oxide precursor is introduced as a vapor. In another embodiment, the metal oxide precursor is introduced as an aerosol. In still another embodiment of the invention, the metal oxide precursor is introduced as a spray, which may contain one or more solvents.

The metal oxide precursor is introduced into the process when the majority of the titanium dioxide particles have been formed. In one embodiment of the invention, the ultrafine $TiO_2$ particles are contacted with the metal oxide precursor at a point downstream of the reaction zone where at least 90% of the $TiO_2$ precursor has reacted to form ultrafine $TiO_2$ particles. In another embodiment, the ultrafine $TiO_2$ particles are contacted with the metal oxide precursor at a point downstream of the reaction zone where at least 95% of the $TiO_2$ precursor has reacted to form ultrafine $TiO_2$ particles.

The metal oxide precursor may be any compound that produces the desired metal oxide upon contacting the titanium dioxide particles. In one embodiment, the metal oxide precursor is selected from silicon halides, hexaalkyldisiloxanes, tetraalkylorthosilicates and silicon containing salts. In another embodiment, the metal oxide precursor is hexamethyldisiloxane or silicon tetrachloride.

In one embodiment, the metal oxide coating is between about 1 nm and about 10 nm thick. In yet another embodiment, the metal oxide coating is between about 2 nm and about 4 nm thick.

Also provided herein are ultrafine titanium dioxide particles comprising a smooth, homogeneous coating of one or more metal oxides on the surface are provided, wherein the coating is between about 1 nm and about 10 nm thick or about 2 nm to about 4 nm thick.

DETAILED DESCRIPTION OF THE INVENTION

Figure 1:
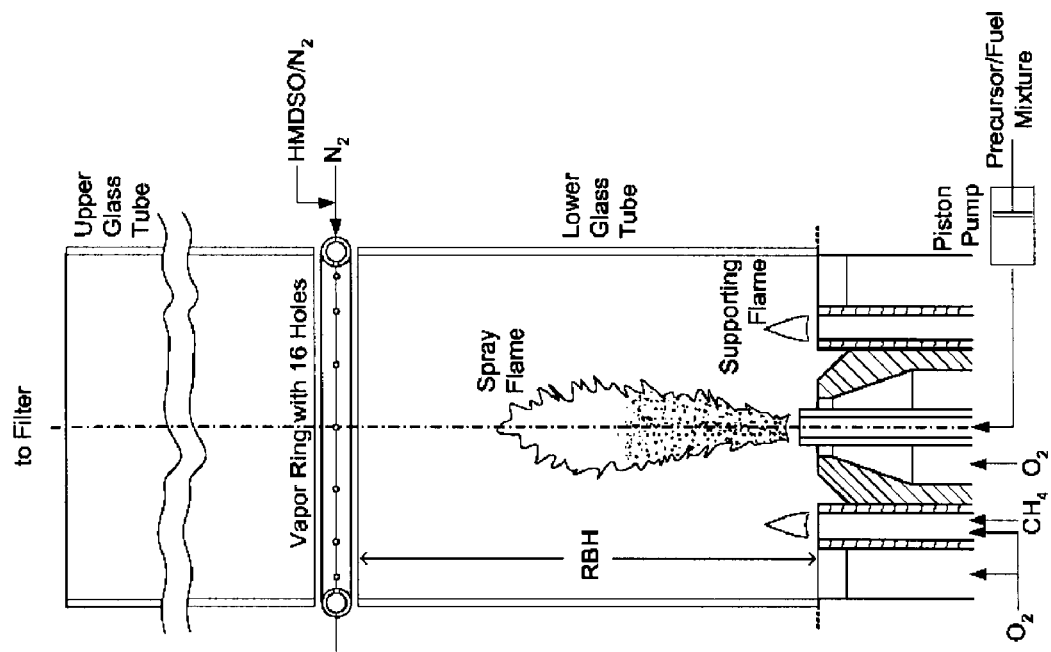
FIG. 1. Experimental set-up with a flame spray pyrolysis (FSP) reactor, lower (RBH) and upper glass tubes and the ring for addition of hexamethyldisiloxane (HMDSO)/$N_2$.

Provided herein are ultrafine titanium dioxide particles coated with a homogeneous layer of a metal oxide and a gas-phase pyrolysis process for the preparation of these coated titanium dioxide particles. The coated titanium dioxide particles of the invention have a high rutile content and are useful in a variety of applications, including in polymer composite compositions.

Definitions

The term "ultrafine titanium dioxide" refers to particles of titanium dioxide that have an average particle size of 1 nm to 100 nm.

The term "primary titania particles" or "primary particles" refers to the titania particles formed in the reaction zone of the process before a second coating component has been introduced. The terms refer to individual particles rather than agglomerates of particles.

The terms "specific surface area" or "SSA" refer to the surface area per mass of a material. The units of specific surface area used herein are $m^2/g$, or square meters per gram.

The terms "metal oxide precursor" or "coating precursor" refer to a compound that produces a metal oxide upon contact with oxygen or water vapor.

The term "reaction zone" is used to refer to the point or position in the process where $TiCl_4$ or any other $TiO_2$ precursor is reacted with oxygen to form $TiO_2$.

The term "coating zone" is used to refer to the point or position in the process where the metal oxide precursor comes in contact with the pre-formed $TiO_2$ particles and results in the formation of a metal oxide coating on the $TiO_2$ particles.

The term "doped" refers to $TiO_2$ particles that comprise other metal oxides in the primary particle. For example, the term "aluminum-doped" refers to $TiO_2$ particles that comprise aluminum oxide in the particles.

The term "halo" or "halogen", as used herein, includes chloro, bromo, iodo, and fluoro.

The term "silyl halide" refers to a mono-, di-, tri- or tetra-halo silicon species, for example $SiCl_4$.

The term "silane" refers to a tetravalent silicon compound, for example $SiH_4$ or $Si(CH_3)_4$.

The term "alkyl" is intended to have its customary meaning, and includes straight, branched, or cyclic, primary, secondary, or tertiary hydrocarbon, including but not limited to groups with $C_1$ to $C_{10}$.

The term "aryl" is intended to have its customary meaning, and includes any stable monocyclic, bicyclic, or tricyclic carbon ring(s) comprising up to 8 members in each ring (typically 5 or 6), wherein at least one ring is aromatic as defined by the Huckel 4n+2 rule, and includes phenyl, biphenyl, or naphthyl.

The term "alkoxy" refers to any moiety of the form —OR, where R is an alkyl group, as defined above.

The term "carrier gas" refers to a gas that carries with it a concentration of the metal oxide precursor in the vapor phase.

The term "homogeneous coating" as used herein refers to metal oxide coating that comprises greater than about 75% of one metal oxide, preferably greater than about 85% of one metal oxide or more preferably greater than about 95% of one metal oxide.

The term "smooth" referring to a coating of a metal oxide on titania particles as used herein, means a uniform coating of a metal oxide on the surface of titania particles that does not contain segregated areas of amorphous and crystalline content of the metal oxide and does not contain areas of the particle surface that do not have a discernable metal oxide coating using the analytical techniques described herein.

Particles size measurements or ranges herein refer to an average particle size of a representative sample.

Pyrolysis processes for the production of titania are known and have been described in detail elsewhere (Madler et al., 2003; Schulz et al., 2005). One particular pyrolysis process is the flame spray pyrolysis (FSP) process. The advantages of the flame spray pyrolysis process for the production of titania include, the ability to dissolve the precursor directly in the fuel, the simplicity of introduction of the precursor into the hot reaction zone (the flame), and flexibility in using the high-velocity spray jet for rapid quenching of aerosol formation. Flame spray pyrolysis processes are commonly used to produce ultrafine particles of metal oxides, and titania in particular.

The surface of titania particles can be passivated by depositing a coating of another metal oxide to lower the photoactivity of the titania particles and prevent the photocatalytic decomposition of substances that incorporate the titania particles. The process described herein provides a smooth and homogeneous coating layer of one or more metal oxide on the titanium dioxide nanoparticles produced by a gas phase oxidation process. In one embodiment of the invention, the process is a pyrolysis process. In another embodiment, the process is a flame spray pyrolysis process (FSP). The coating layer is produced by generation of a vapor phase containing a metal oxide precursor downstream of the reaction zone of the reactor. The metal oxide precursor is deposited on the pre-formed titania nanoparticles as they exit the oxidation reaction zone and pass through the coating zone of the reactor. The metal oxide coating is not limited and may comprise any desired metal oxide depending on the desired characteristics of the coated nanoparticles. The thickness of the metal oxide coatings produced by the present invention may be varied by the concentration of the metal oxide precursor in the coating zone of the reactor. In addition, the oxide coating can comprise more than one layer of metal oxide. For example, the process described herein can produce ultrafine titania particles with separate layers of two or more metal oxides or mixed metal oxides.

The surface coating of pigmentary titania by the deposition of a silica precursor after the titania particles have formed has been described. U.S. Pat. No. 5,562,764 ('764 patent) to Gonzalez describes a process where $SiCl_4$ is added downstream of the $TiCl_4$ and oxygen reaction zone in a plug flow reactor. The patent discloses that the $SiCl_4$ must be added at a temperature of between about 1200° to about 1600° C. and at a pressure of between 5-100 psig. Only silicon halides are used as a silica precursor. International Application Publication No. WO 96/36441 ('441 publication) describes a processes to form pigment-grade titania coated with a second metal oxide. Similar to the '764 patent, the '441 publication discloses that the temperature at which a silica precursor is added to the process must be greater than 1300° C. to ensure that the silica precursor completely reacts to form $SiO_2$. The titania particles produced by these processes are not ultrafine particles. The minimum temperature disclosed in the '764 patent and the '441 publication for the addition of the silica precursor is consistent with the description in the '441 publication that a sufficiently high temperature is required to enable the silica precursor to form $SiO_2$ on the surface of the $TiO_2$ particles.

U.S. Pat. No. 6,852,306 ('306 patent) to Subramanian et al. and U.S. Pat. No. 7,029,648 ('648 patent), which is a continuation of the '306 patent, describes a process for preparation of rutile titanium dioxide pigment which is coated with a second metal oxide layer. The '306 and '648 patents disclose that the metal oxide coating consists of a layer of amorphous oxides of aluminum and silicon that is not more than 4 nm thick. The composition of the coating layer is about 1% by weight $Al_2O_3$ and 1.2% by weight $SiO_2$, although $SiCl_4$ is introduced after the $TiO_2$ particles have formed to at least 97%. The '306 and '648 patents disclose that the temperature should be no greater than about 1200° C. when the $SiCl_4$ is introduced. A method to calculate the point of $SiCl_4$ addition is also disclosed.

In contrast to the processes described above, the present invention utilizes a gas phase oxidation process to prepare ultrafine titania with an average particle size of about 15 nm to about 100 nm. In one embodiment, the process is a pyrolysis process. In another embodiment, the process is a flame spray pyrolysis process. The coating of ultrafine particles presents significant challenges compared to the coating of larger pigment-grade particles because the coating of nanoparticles with a smooth, homogeneous coating of a metal oxide becomes increasingly more difficult as the particle size of the product decreases. To obtain the same thickness of coating, ultrafine particles require a larger amount of the precursor material and this results in a larger amount of the coating material being present in the product. For instance, for 20 nm particles, it takes about 25% silica to obtain a coating thickness of 2 nm while for 100 nm particles, it takes only 10% silica to obtain the same thickness. The use of larger concentration of coating precursors leads to discrete particles of silica on inhomogeneous and rough coatings. Furthermore, it is surprising that ultrafine titania particles produced flame spray pyrolysis process can be homogeneously coated downstream of the reaction zone where the temperature is significantly lower. The processes disclosed in U.S. Pat. No. 5,562,764 and WO 96/36441 indicate that the metal oxide precursor should be added when the temperature is at least 1200° C. or 1300° C., respectively to ensure that the precursor is completely oxidized to $SiO_2$. The process described in U.S. Pat. Nos. 6,852,306 and 7,029,648 disclose a lower temperature of addition of $SiCl_4$, but describe that the resulting coating layer is an approximately 1:1 mixture of $Al_2O_3$ and $SiO_2$.

Although not being bound by theory, the metal oxide coating layer may be formed by condensation of the metal oxide precursor on the titania particles followed by oxidation of the precursor to form the metal oxide. Alternatively, the metal oxide precursor may form the oxide by a gas-phase oxidation of the precursor followed by deposition and sintering on the titania particles. These coating routes were also suggested for gas-phase $SiO_2$ coating of $TiO_2$ in an aerosol flow hot-wall reactor (Powell et al., 1997). The coating of the titania particles by the process described herein forms a smooth and homogeneous layer covering the titania particles.

The titanium dioxide particles produced in pyrolysis reactors by methods known in the art can have a high rutile form content and a desired particle size range and morphology depending on the process parameters and doping of the titanium precursor feed with the appropriate compound. The production of ultrafine titania by the pyrolysis process may occur at temperatures from about 600° C. to about 2400° C. In other embodiments, the titania is formed at a temperature of between about 600° C. to about 2000° C., between about 600° C. to about 1500° C. or between 600° C. to about 1000° C.

Titanium dioxide precursors are titanium-containing compounds that form titanium dioxide when subjected to high temperatures in the presence of oxygen. Although the process of the invention is not limited by choice of a particular titanium dioxide precursor, suitable titanium compounds useful in the invention include, but are not limited to, titanium alkoxides and titanium halides. Preferred titanium alkoxides are titanium tetraisopropoxide, titanium tetraethoxide and titanium tetrabutoxide. Titanium halides include titanium trichloride and titanium tetrachloride. In a particular embodiment of the invention, $TiCl_4$ is used as a $TiO_2$ precursor.

Doping certain metal oxide precursors in the feed of the flame oxidation reaction can impact the form of the titania nanoparticles produced. Various dopants are added into the flame to control the characteristics of the powders produced such as the phase composition, morphology, degree of aggregation, and the primary particle size. For example, increasing concentration of $SiCl_4$ in the gas phase production of titania is known to affect the form of the titania produced by inhibiting the phase transformation of the anatase form to the rutile form. However, inclusion of aluminum precursors into the feed of the gas phase oxidation of titania favors the formation of the rutile form of the product. In flame oxidation of $TiCl_4$, addition of 1% to 10% of a volatile silicon compound has been shown to produce more than 90% anatase titania while addition of 1% to 10% of an aluminum compound results in predominantly the rutile form of titania (Vermury and Pratsinis, 1995). The present invention allows the coating of titania particles with metal oxides without exerting an undesired effect on the titania primary particles because the titania particles are pre-formed and are not substantially modified during the coating step.

The metal oxide coating precursor is optimally introduced at a point downstream of the reaction zone of the $TiO_2$ precursor and oxygen so that the majority of the titania particles are formed before contact with the coating precursor. In this way, introduction of the coating precursor will not substantially change the characteristics of the titania particle. For example, introduction of a silica precursor after the majority of the titania particles have substantially completely formed will avoid the effect of silicon to inhibit the phase transformation from the anatase form to rutile.

Therefore, it is a significant advantage of the present process to provide the coating layer of one or more metal oxides after the titania nanoparticles with the desired characteristics have been formed in the pyrolysis reactor. For example, the titania particles formed in the pyrolysis reactor can be formed in the desired rutile form, which is fixed at this point in the process and not affected by the subsequent coating with $SiO_2$. Another significant advantage of the present invention is that titania with a smooth, homogeneous coating of a metal oxide can be obtained with a minimum amount of metal oxide precursor because unnecessary material is not wasted by unspecific formation of the metal oxide on the titania particles or agglomeration of the metal oxide material on the titania particles. Furthermore, with the present process, the metal oxide coating component is located only on the surface of the titania particles rather than dispersed throughout the particles.

In one embodiment of the invention, at least about 70% of the $TiO_2$ precursor has been reacted to form titanium dioxide particles before the metal oxide precursor is introduced into the product stream. In another embodiment, at least about 80% of the $TiO_2$ precursor has reacted to form titanium dioxide particles. In still another embodiment, at least about 90% of the $TiO_2$ precursor has reacted to form titanium dioxide particles. In yet other embodiments, at least 95%, 98%, 99% or 99.5% of the $TiO_2$ precursor has reacted to form titanium dioxide particles before the metal oxide is introduced.

The temperature at which the metal oxide coating precursor is introduced is also an important parameter that impacts the extent to which the titanium dioxide particles have been completely formed. In one embodiment, the metal oxide coating precursor is added at a point in the process where the temperature is less than about 1300° C. In other embodiments, the coating precursor is introduced at a temperature of less than about 1200° C. or less than about 1100° C. In yet further embodiments of the invention, the coating precursor is introduced into the product stream at a temperature of less than about 1000° C. or less than about 900° C.

The titania particles formed in the reactor may be formed with a pure titanium dioxide precursor, such as $TiCl_4$, or may include one or more dopants known in the art to produce titania with desired characteristics. Dopants include but are not limited to precursors that produce aluminum oxide, silicon oxide, iron oxide, zirconium oxide, boron oxide, zinc oxide and tin oxide species in the titania particles. A combination of dopants may be added to the process to produce titania particles with desired characteristics. The precursors may be any compound that may be introduced into the flame with the $TiO_2$ precursor, including but not limited to silanes, silicon halides, alkylhalosilanes or alkylarylsilanes, silicon alkoxides including tetramethylorthosilicate or tetraethylorthosilicate and the like; aluminum halides, aluminum trialkoxides such as aluminum triisopropoxide, aluminum acetylacetonate and the like. Other precursors include $FeCl_3$, $ZrCl_4$, $POCl_3$, $BCl_3$, and $Al_2Cl_6$. The amount of the doping component is dependent on the characteristics desired in the titania particle and the effect of the dopant on the titania particles. In one embodiment, sufficient dopant is introduced with the $TiCl_4$ into the reaction zone of the process to produce from about 1% to about 50% dopant by weight of the titania particle. In other embodiments, sufficient dopant is added to produce from about 0.1% to 10%, about 0.5% to about 5% or from about 0.5% to about 3% dopant by weight in the titania particle. In yet another embodiment, the dopant is introduced in a quantity to provide a concentration of between about 0.5% to about 2% by weight of the titania particle.

In one embodiment, titanium dioxide nanoparticles doped with an aluminum oxide precursor are produced in a gas phase oxidation process to produce a high concentration of the rutile form of the titanium dioxide with the desired morphology. Aluminum precursors for use in processes are known in the art. Non-limiting examples of aluminum precursors include aluminum halides such as $AlCl_3$, $AlBr_3$, $AlI_3$, $AlF_3$, $Al_2Cl_6$, aluminum trialkoxides, such as $Al(OR)_3$, where R is alkyl or aryl including aluminum triisopropoxide; and acyl aluminum species such as aluminum acetylacetonate. It has been reported that doping $TiCl_4$ with aluminum produced pure rutile titania while preparation of titania in the absence of aluminum resulted in titania mostly in the anatase form (Akhtar and Pratsinis, 1994). The aluminum precursor may be introduced into the process in sufficient quantity to produce titania with an $Al_2O_3$ concentration such that the titania produced has high content of the rutile form.

The Al-doped titania particles of the present invention comprise between about 0.1 to about 20% $Al_2O_3$ by weight of the titania particle. In other embodiments, sufficient dopant is added to produce from about 0.1% to 10%, about 0.5% to about 5% or from about 0.5% to about 3% $Al_2O_3$ by weight in the titania particle. In yet another embodiment, the dopant is introduced in a quantity to provide a concentration of between about 0.5% to about 2% $Al_2O_3$ by weight of the titania particle. In even further embodiments, titania particles with 2%, 4%, 6%, 8% or 10% $Al_2O_3$ by weight of the titania particles are produced.

In addition to metal oxide dopants, water vapor or hydrated metal oxides may be used in the titania reaction. The reaction mixture may also contain a vaporized alkali metal salt to act as a nucleant. The alkali metal salts include inorganic potassium salts including KCl, and organic potassium salts. Cesium salts including CsCl may also be used in the reaction.

The titania produced by the invention has a high rutile form content which is desirable in certain optical applications. The anatase form has a higher photocatalytic activity and can introduce degradation in polymer matrices in which it is incorporated. In one aspect of the invention, the titania is at least 50% by weight in the rutile form. In another embodiment, the titania produced is at least 60% in the rutile form. In still other embodiments, the titania produced is at least 70%, 80%, 90% or 95% by weight in the rutile form. In yet other embodiments, the titania produced is at least 98% or 99% by weight in the rutile form. Furthermore, the present invention allows for the coating of the titania particles with smooth homogeneous metal oxide coatings of metal oxides which normally promote the formation of the anatase form of titania. For example, it is known that introduction of silica precursors to the feed of the titania forming reaction promotes the formation of the anatase form of titania. The process described herein avoids the unwanted side effect of doping with silica precursors and provides titania particles with a high rutile content which are surface coated with a smooth and homogeneous layer of silica to achieve enhanced stability of the particles and polymer matrices which incorporate these materials.

The titania particles produced by the present invention are ultrafine particles with a particle size of about 15 nm to about 100 nm. As noted previously, there are many uses and advantages to ultrafine titania compared to pigmentary titania, which has a larger particle size. Pyrolysis processes are capable of producing mixed metal oxide particles in the 1-200 nm range from low cost precursors with production rates up to 250 g/h (Madler, 2002). Temperature zones and particle residence times in these processes are key in determining the particle growth. In one embodiment, the particle size range of the coated titanium dioxide particles is between about 15 nm to about 80 nm. In another embodiment, the particle size of the titanium dioxide particles is between about 15 nm to about 60 nm. In still other embodiments, the particle size range of the particles is between about 15 nm to about 50 nm, about 15 nm to about 40 nm, about 15 nm to about 30 nm or about 15 nm to about 20 nm.

The specific surface area (SSA) of the titania ultrafine particles of the present invention may be between about 15 $m^2/g$ and about 400 $m^2$. In one embodiment of the invention, the SSA of the titania particles is between about 15 $m^2/g$ and about 300 $m^2/g$. In still other embodiments, the SSA of the particles produced is between about 15 $m^2/g$ and about 200 $m^2/g$, about 15 $m^2/g$ to about 100 $m^2/g$ or between about 15 $m^2/g$ to about 70 $m^2/g$.

The metal oxide coating is not limited to any one specific metal oxide and may comprise any desired metal oxide depending on the desired characteristics of the coated nanoparticles. For example, the nanoparticles of the present invention may be coated with a smooth, homogeneous layer of one or more of $SiO_2$, $Al_2O_3$, $B_2O_3$, $ZrO_2$, $GeO_2$, $WO_3$, $Nb_2O_5$, MgO, ZnO or $SnO_2$ by choosing a suitable metal oxide precursor. The metal oxide coating can also comprise one or more metal oxide or mixed metal oxides, for example species described by the formula $[SiO_2]_x [Al_2O_3]_y$, where x=0 to 1 and y=0 to 1. And sum of x and y=1

Suitable metal oxide precursors are any substance that produce the desired metal oxide upon contact with the nanoparticles. For example, the nanoparticles may be coated by a homogeneous layer comprising $SiO_2$ by introducing a $SiO_2$ precursor into the coating zone of the reactor. Silica precursors include any silicon compound that is a liquid or a gas at the temperature and pressure of the coating step of the process. The $SiO_2$ precursors include but are not limited to silanes, silicon tetrahalides, such as $SiCl_4$, $SiBr_4$, $SiF_4$ or $SiI_4$; alkyl or aryl silylhalides, such as trimethylsilylchloride (($CH_3)_3SiCl$) or triphenylsilylchloride; alkyl or aryl silyl dihalides or tri-halides; hexalkyldisiloxanes, including hexamethyldisiloxane, $(CH_3)_3SiOSi(CH_3)_3$); mono-, di-, tri- or tetraalkoxysilanes, including tetraalkyl orthosilicates such as tetraethylorthosilicate or tetramethylorthosilicate and the like, or tetraaryl orthosilicates; alkylthiosilanes or arylthiosilanes; tetraalkylsilanes including tetramethyl or tetraethylsilane; tetraallylsilane; tetraarylsilanes; tetravinylsilanes; tetrabenzylsilanes; tetralkyl- or tetraaryldisilanes; tetraalkyl- or tetraaryldisilazanes; trialkyl- or triarylsilylacetates or sulfonates; and mixtures thereof. It is understood that the silicon precursor species with a mixture of groups on the silicon are also used in the invention. For example a compound such as phenyldimethylchlorosilane is a suitable silica precursor.

Similarly, suitable aluminum oxide, magnesium oxide, zinc oxide and tin oxide precursors may be used to coat the $TiO_2$ particles with the desired oxide. For example suitable aluminum oxide precursors include but are not limited to aluminum halides including $AlX_3$ and $Al_2X_6$, where X is chloro, bromo, iodo or fluoro; aluminum trialkoxides (Al (OR)$_3$ including aluminum triisopropoxide; aluminum acyl compounds including aluminum acetylacetonate; and tetralkyldialuminoxanes ($R_2Al$—O—$AlR_2$).

Certain metal oxide precursors will be volatile at the temperatures used in the process. For example, $SiCl_4$ has a boiling point of 57° C. and hexamethyldisiloxane has a boiling point of 101° C. and can be vaporized easily with a carrier gas. In some cases, the metal oxide precursors will need to be pre-heated to produce the desired concentration in the gas phase for coating the titania particles. For example, it is known in the art that $AlCl_3$ must be heated to achieve a sufficient vapor pressure of $AlCl_3$ to transport controlled amounts of the compound by a carrier gas. In certain embodiments, the metal oxide precursor may be cooled to lower the vapor pressure of the material and lower the concentration in the feed to the process.

The metal oxide coating precursor is introduced into the process downstream of the flame reaction zone by any suitable methods known in the art. As described above, it is most beneficial to introduce the metal oxide precursor at a point downstream of the $TiO_2$ particle formation so that the characteristics of the titania particles are not altered by the coating of the particles. The selection of the metal oxide precursor injection point is chosen based on the extent of formation of the $TiO_2$ particles. The metal oxide coating precursor may be introduced into the process as a vapor carried by a gas or in the form of an aerosol through one or more slots or openings downstream of the flame reaction zone. The metal oxide precursor may be pre-heated prior to introduction into the reactor. Sprays of a liquid metal oxide precursor, optionally in a suitable solvent, may be used. In other embodiments, the coating precursor may be introduced into the coating zone through a porous wall element or through openings in a tube element placed downstream of the flame reaction zone. It will be apparent to persons skilled in the art that the number of openings or nozzles used to introduce the metal oxide precursor is not limited and may be adjusted to produce the desired concentration of the metal oxide precursor in the coating zone of the reactor.

The preparation of aerosols is well known in the art and this technology is used to prepare aerosols of non-volatile metal oxide precursors. For example, an aerosol of an oxide precursor may be formed from an aqueous solution of the metal oxide precursor with an ultrasonic nebulizer or other suitable means. Salt solutions of the oxide precursors may also be used to form aerosols.

In one embodiment of the invention, a metal oxide coating may be applied to the pre-formed $TiO_2$ particles downstream of the reaction zone by introducing a metal oxide coating precursor with oxygen into a second flame in a pyrolysis reactor to produce the metal oxide. The metal oxide formed in this matter is introduced into the reactor so that it comes into contact with the pre-formed $TiO_2$ particles. Methods known in the art may be used to produce the metal oxide in this manner, and any of the metal oxide precursors discussed herein may be used with this embodiment of the invention. It will be apparent to one skilled in the art that the parameters of the second flame, including flow rate of the metal oxide precursor and oxygen as well as the temperature of the flame can be controlled to optimum settings depending on the specific metal oxide required for the coating layer.

Once the metal oxide precursor has contacted the titania particles and deposited a coating of the metal oxide, the coated titania particles are isolated or collected downstream of the coating zone. Any suitable methods known in the art may be used to isolate or collect the coated titania particles. For example, the coated particles may be isolated on a filter.

The thickness of the metal oxide coating is controlled by the concentration of the metal oxide precursor in the coating zone of the pyrolysis reactor. In general, higher concentrations of metal oxide precursor will result in thicker coating layers on the ultrafine titania particles. When the metal oxide precursor is a liquid, the vapor can be generated by passing a carrier gas through a solution of the liquid. For example, a suitable carrier gas may be bubbled through a liquid sample of $SiCl_4$ or HMDSO to generate a vapor phase with a desired concentration of the $SiO_2$ precursor. The concentration of the metal oxide precursor vapor in the coating zone can be adjusted by the flow rate of the carrier gas and the temperature of the precursor liquid. Higher concentrations of the metal oxide precursor are achieved by increasing the rate that the carrier gas passes through the liquid or by increasing the temperature of the liquid, which increases the vapor pressure and the concentration of the metal oxide precursor in the vapor phase. These parameters are easily adjusted by standard methods known in the art.

The concentration of the metal oxide precursor in the vapor phase may be adjusted to obtain titania particles with a concentration of between about 1% to about 50% by weight of the metal oxide coating component in the coated product. In one embodiment, the concentration of the metal oxide coating component in the coated titania particles is between about 1% to about 30% by weight. In other embodiments, the concentration of the metal oxide coating component in the titania product is between about 1% to about 20%, about 2% to about 15%, about 2.5% to 10%, about 5% to about 20%, or about 10% to about 20% by weight of the coated product.

The coated ultrafine titania particles of the present invention will contain metal oxide coating layers about 1 nm to about 10 nm thick. In one embodiment, the metal oxide coating layer is from about 2 nm to about 8 nm thick. In other embodiments, the metal oxide coating layer is from about 2 nm to about 6 nm thick or from about 2 nm to about 4 nm thick.

In one exemplary embodiment, titania particles prepared by a pyrolysis process are coated with a smooth, homogeneous $SiO_2$ coating by introducing a silica precursor downstream of the flame reaction zone where $TiCl_4$ and oxygen form $TiO_2$ particles. Hexamethyldisiloxane (HMDSO) is introduced as a vapor into the pyrolysis reactor downstream of the $TiO_2$ particle formation zone by a carrier gas. The HMDSO contacts the titania ultrafine particles and is oxidized to form a smooth and homogeneous coating of $SiO_2$ on the surface of the titania particles. It is understood that the process is not limited to HMDSO but any silica precursor may be used that is a gas or liquid at the temperature and pressure of the coating step. For example, $SiCl_4$ or $Si(CH_3)_4$ or other suitable precursors may be used in place of HMDSO. The efficiency of the titania surface passivation is measured by the ability of the coated particles to catalyze the photo-induced conversion of isopropanol to acetone. Particles that have been more effectively passivated by the deposition of a smooth and homogeneous coating of $SiO_2$ on the surface will have a lower catalytic activity, demonstrated by a lower amount of acetone produced.

FIG. 1 shows a schematic of an example flame spray pyrolysis reactor used to produce the ultrafine titanium dioxide particles of the present invention comprising a homogeneous coating of a metal oxide. The embodiment illustrated is not intended to be limiting but to provide an example of the process for coating one possible metal oxide on titania nanoparticles. Solutions of a titanium dioxide precursor and an aluminum oxide precursor are fed through an inner nozzle capillary and dispersed by oxygen gas flow supplied through a surrounding annulus. The concentration of the solutions is not critical but can be adjusted to produce the desired concentration of $TiO_2$ precursor and aluminum dopant in the flame oxidation zone. In the illustrated embodiment, the precursor solution spray is ignited by a ring-shaped, methane/oxygen premixed flame at the nozzle base to produce nanoparticles of 2, 4, 6, 8 or 10 wt. % $Al_2O_3$ in $TiO_2$.

For comparison, nanoparticles containing silicon dioxide were also prepared by adding a silica precursor to the $Al/TiO_2$ precursor solution prior to introduction into the flame. This is analogous to processes where the $TiCl_4$ and silica precursors are introduced into the reaction zone of the process simultaneously. The materials produced are designated as $xSi/TiO_2$, $yAl/TiO_2$ or $xSi/yAl/TiO_2$ depending on the weight fraction of $Al_2O_3$ and $SiO_2$ present in the $TiO_2$. For example, $10Si/TiO_2$ contains 10 wt % $SiO_2$ and 90 wt. % $TiO_2$, while $10Si/_4Al/TiO_2$ is composed of 10 wt. % $SiO_2$, 4 wt. % $Al_2O_3$ and 86 wt. % $TiO_2$.

FIG. 1 shows a quartz glass tube of varying length, designated herein as ring burner height (RBH), that surrounds the flame oxidation zone. In one embodiment, the inner diameter of the quartz tube was 4.5 cm, and the RBH was varied from 5, 10, and 20 to 30 cm.

At the upper edge of the glass tube, surrounding the spray aerosol, is placed a metal torus ring which contains varying equidistant radial openings. Through the openings in the torus ring, a metal oxide precursor carried by a gas is injected into the path of the aerosol spray, thereby depositing a homogeneous layer of metal oxide on the pre-formed Al-doped $TiO_2$ nanoparticles. The carrier gas is not important as long as it does not react with the metal oxide precursors or with the titania particles. Suitable carrier gasses include nitrogen, argon and other non-reactive gasses. In the illustrated embodiment, nitrogen gas carrying HMDSO is injected along with additional nitrogen to keep constant either the power input (defined as the ring $N_2$ kinetic energy) or the total nitrogen flow rate. For example, HMDSO is added through 16 openings.

In the illustrated embodiment, the diameter of the metal torus ring is 4.5 cm and the diameter of the metal pipe is 3.8 mm. The number of openings in the metal torus can be varied depending on the diameter of the torus ring and the desired coverage area. In the illustrated embodiment, the metal torus ring contained 1, 2, 4, 8 or 16 openings that were 0.6 mm in diameter. However, it will be apparent to one skilled in the art that the number of openings or the diameter of the openings is not limited and can be varied to achieve the desired concentration of metal oxide precursor in the coating zone depending on the amount of coating layer desired on the titania particles.

A second quartz glass tube is placed above the vapor ring. Once the particles are coated by the metal oxide, the nanoparticles are then directed to a filter unit that collects the product.

The present invention will be understood more readily by reference to the following examples, which are provided by way of illustration and are not intended to be limiting of the present invention.

EXAMPLES

Experimental

Preparation of $Al_2O_3$/$TiO_2$ Particles and In-Situ Coating with $SiO_2$

Precursor solutions (1 M) were prepared from titanium-tetra-isopropoxide (TTIP, Aldrich, purity>97%) and aluminum sec-butoxide (Al(s-BuO)$_3$), Aldrich, purity>97%) in xylene (Fluka, >98.5%) resulting in 2, 4, 6, 8 or 10 wt % $Al_2O_3$/$TiO_2$. $SiO_2$/$TiO_2$ or $SiO_2$/$Al_2O_3$/$TiO_2$ particles were produced by adding hexamethyldisiloxane (HMDSO, Aldrich, purity>99%) to these precursor solutions. All solutions were fed at 5 ml/min through the inner nozzle capillary and dispersed by 5 l/min oxygen (Pan Gas, purity>99%) supplied through the surrounding annulus. The pressure drop at the nozzle tip was maintained at 1.5 bar. The precursor solution spray was ignited by a ring-shaped, methane/oxygen (1.5/3.2 l/min) premixed flame at the nozzle base.

The experimental set-up for in-situ silica-coating of aluminum-doped titania particles made by a flame spray pyrolysis (FSP) process is shown in FIG. 1. The FSP reactor was operated as described previously producing Al-doped $TiO_2$. The flame was sheathed with 40 l/min $O_2$ and surrounded by a quartz glass tube (ID=4.5 cm) 5, 10, 20 or 30 cm in length (ring-burner-height: RBH). At its upper edge, a metal torus (pipe diameter=3.8 mm) ring (ID=4.5 cm) with 1, 2, 4, 8 or 16 equispaced radial openings, 0.6 mm each in diameter, was placed surrounding the spray aerosol. Through these openings, $N_2$ gas carrying HMDSO vapor as coating precursor was injected along with additional 5, 10, 15, 20, 25 or 30 L/min $N_2$. The additional $N_2$ flow rate was chosen to keep constant either the power input (defined as the ring $N_2$ kinetic energy) or the total $N_2$ flow rate. Standard conditions applied, unless otherwise stated, refer to a spray flame producing 4Al/$TiO_2$ (23.6 g/h) with HMDSO added through 16 openings at 20 cm RBH and 15 L/min additional $N_2$ (Table 1). This corresponds to a power input of 0.4 W. Above the vapor doping ring another quartz tube 30 cm (ID=4.5 cm) long was placed.

Process parameters for in-situ $SiO_2$ coating of $Al_2O_3$/$TiO_2$ are shown in Table 1 below. The standard settings applied if not otherwise stated are shown in bold.

TABLE 1

Process Parameters

| | |
|---|---|
| wt % $Al_2O_3$ | 4, 6, 8, 10 |
| Ring-burner-height RBH, cm | 5, 10, 20, 30 |
| Ring $N_2$, L/min | 5, 10, 15, 20, 25, 30 |
| wt % $SIO_2$ | 2.5, 5, 10, 15, 20 |
| Upper tube length, cm | 5, 10, 20, 30 |

The HMDSO vapor was supplied either from a bubbler or an evaporator (Bronkhorst). In the bubbler, liquid HMDSO was in a glass flask immersed in a silicon oil bath maintained at 10.5° C. and a $N_2$ stream (0.8 L/min) was bubbled through the HMDSO for 20 wt % $SiO_2$ coating (5.9 g/h $SiO_2$) in the product powder (standard; Table 1). To achieve lower metal oxide concentrations (2.5, 5, 10, 15 wt % $SiO_2$) the temperature of the bubbler was reduced to 4.5° C. and the nitrogen flow rate adjusted to yield the desired $SiO_2$ production rate. The evaporator was used when the pressure drop over the vapor doping ring became too high for operation of the bubbler. The evaporator and its exit manifold were heated to 75° C. as the HMDSO was carried by 0.8 L/min $N_2$. That HMDSO/$N_2$ stream was mixed immediately at the exit of the units with the additional $N_2$ and fed to the torus ring above the FSP nozzle. The BET nitrogen adsorption and X-ray diffraction (XRD) properties were similar when using either evaporator or bubbler verified for 2 openings at 1.0 W (5 L/min $N_2$).

Particle Characterization

The product powders were deposited onto a holey carbon foil supported on a copper grid for further analysis by transmission electron microscopy (TEM, microscope: CM30ST, LaB$_6$ cathode) and scanning transmission electron microscopy (STEM, microscope: Tecnai F30, field emission cathode). Both microscopes were operated at 300 kV and have a SuperTwin lens with a point resolution of ~2 Å (Fa. FEI, Eindhoven). STEM images were recorded with a high angle annular dark field detector (HAADF). The presence of Ti, Al and Si at selected spots in STEM images was determined by energy-dispersive X-ray (EDX) analysis (Fa. EDAX detector).

X-ray diffraction (XRD) patterns were obtained with a Bruker AXS D8 Advance diffractometer (40 kV, 40 mA, Karlsruhe, Germany) operating with Cu K$_\alpha$ radiation. The anatase and rutile crystallite sizes, $x_a$ and $x_r$, respectively, and phase composition were determined by the fundamental parameter approach and the Rietveld method (Cheary and Coelho, 1998). The BET powder-specific surface area (SSA), was measured by nitrogen adsorption at 77 K (Micromeritics TriStar) after degassing the samples, at least, for 1 h at 150° C. in nitrogen.

The photooxidation of isopropyl alcohol using the FSP-made particles was studied by monitoring the released acetone concentration by gas chromatography after 30 minutes reaction time. Inhibition of the photocatalytic activity of titania by the SiO$_2$ surface coating was demonstrated by the amount of acetone produced from isopropyl alcohol. Lower amounts of acetone produced in the photocatalytic degradation reaction is indicative of a lower activity of the coated titania particles.

Example 1

Influence of Silica Content on Particle Morphology

Figure 2:
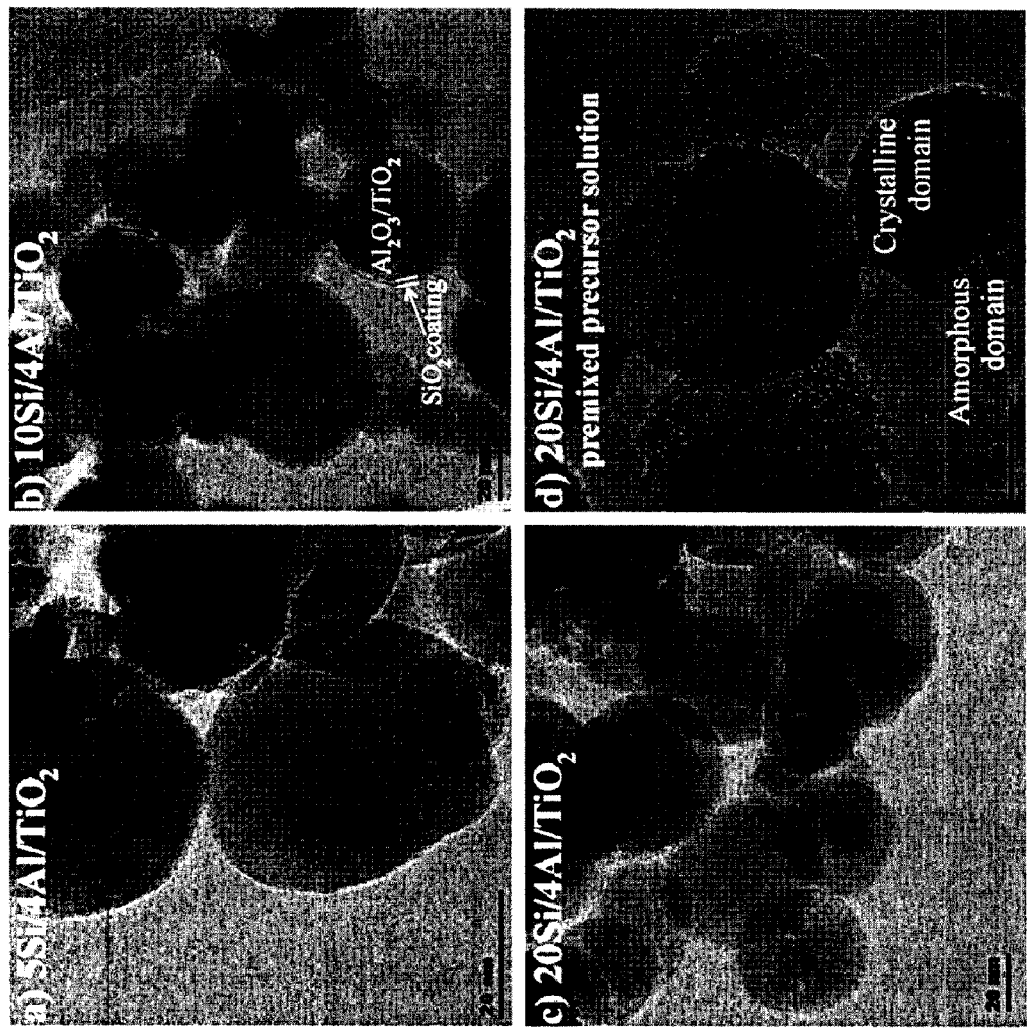
FIG. 2. Transmission electron microscopy (TEM) images of 4Al/$TiO_2$ coated with 5 wt. % (a), 10 wt. % (b) and 20 wt. % (c) $SiO_2$ by addition of HMDSO vapor at 20 cm RBH and 15 L/min $N_2$ through the ring. Segregation in amorphous and crystalline domains is obtained by premixing Si/Al/Ti in the FSP precursor solution (d).

FIG. 2 shows Al-doped TiO$_2$ particles coated with 5 wt. % (a), 10 wt. % (b) and 20 wt. % (C) SiO$_2$. At 5 wt % SiO$_2$ (FIG. 2a) coatings are not visible in the TEM image but a thin amorphous layer could still be present on the particle surface. All Al-doped titania particles with 10 wt. % (FIG. 2b) and 20 wt % SiO$_2$ (FIG. 2c) are homogeneously coated with a homogeneous layer of SiO$_2$ 2-4 nm thick. Separate amorphous particles were not observed at any SiO$_2$ content. In contrast, when HMDSO is introduced with the TiO$_2$ precursor solution, particles segregated in amorphous and crystalline domains are obtained (FIG. 2d) along with some coated particles. This is analogous to the process described in U.S. Pat. No. 7,083,769, which describes the introduction of a silica precursor (SiCl$_4$) simultaneously with the TiCl$_4$ into the flame of a FSP reactor. The segregation of amorphous silica and crystalline titania was confirmed by EDX and STEM analysis, as has also been shown for SiO$_2$/TiO$_2$ at the same composition from vapor flames (Teleki et al., 2005). Homogeneously SiO$_2$ coated TiO$_2$ particles could only be produced in these flames by a rapid cooling of the flame by nozzle quenching (Teleki et al., 2005).

Figure 3:
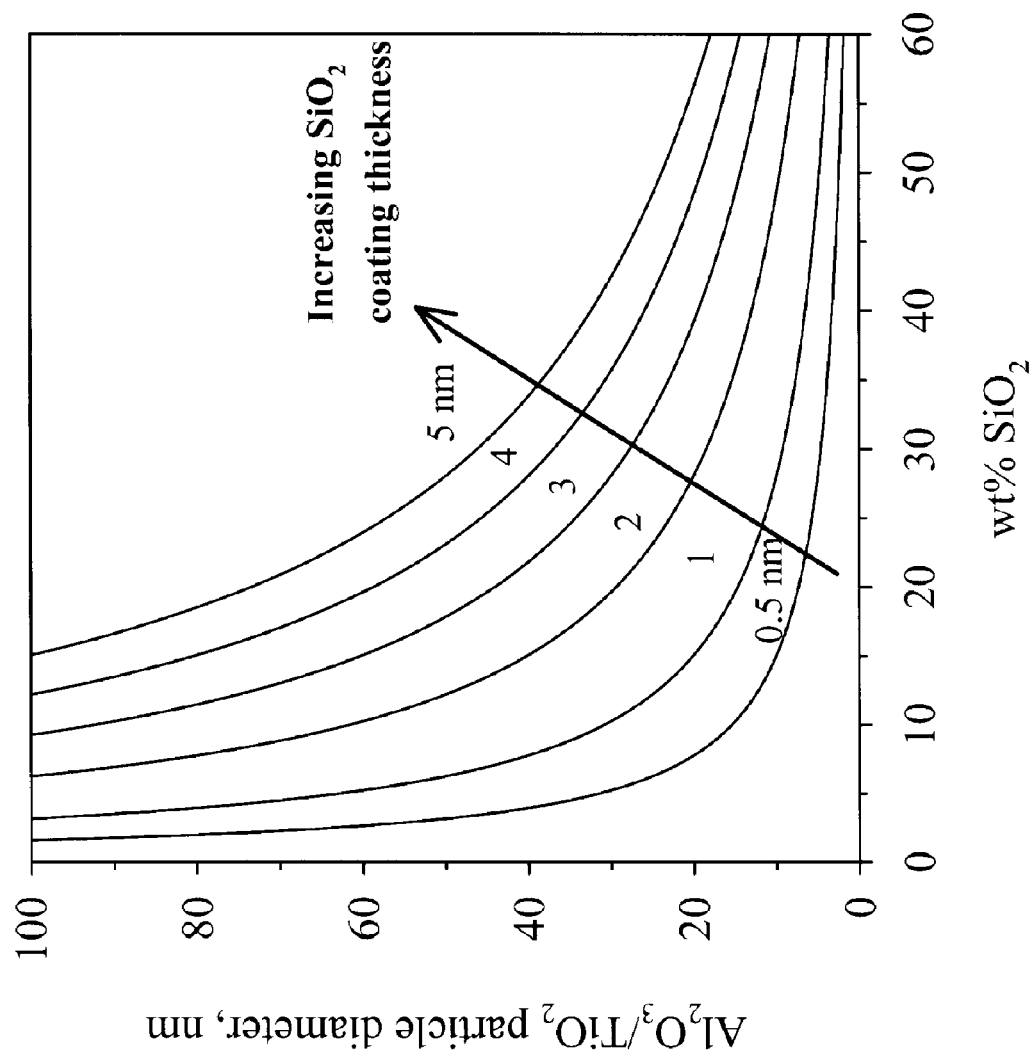
FIG. 3. Theoretical coating thickness as a function of silica content and 4Al/$TiO_2$ core particle diameter.

The theoretical coating thickness as a function of silica content and alumina/titania core particle diameter is shown in FIG. 3. For example, coating 40 nm core particles with 5 wt % SiO$_2$ results in a layer thickness of <1 nm (FIG. 3) that is not visible in TEM (FIG. 2a). Adding 20 wt % to the same core particles results in a theoretical coating thickness of 2-3 nm (FIG. 3) that is in agreement with TEM (FIG. 2c) thus closing the mass balance for the system.

Figure 4:
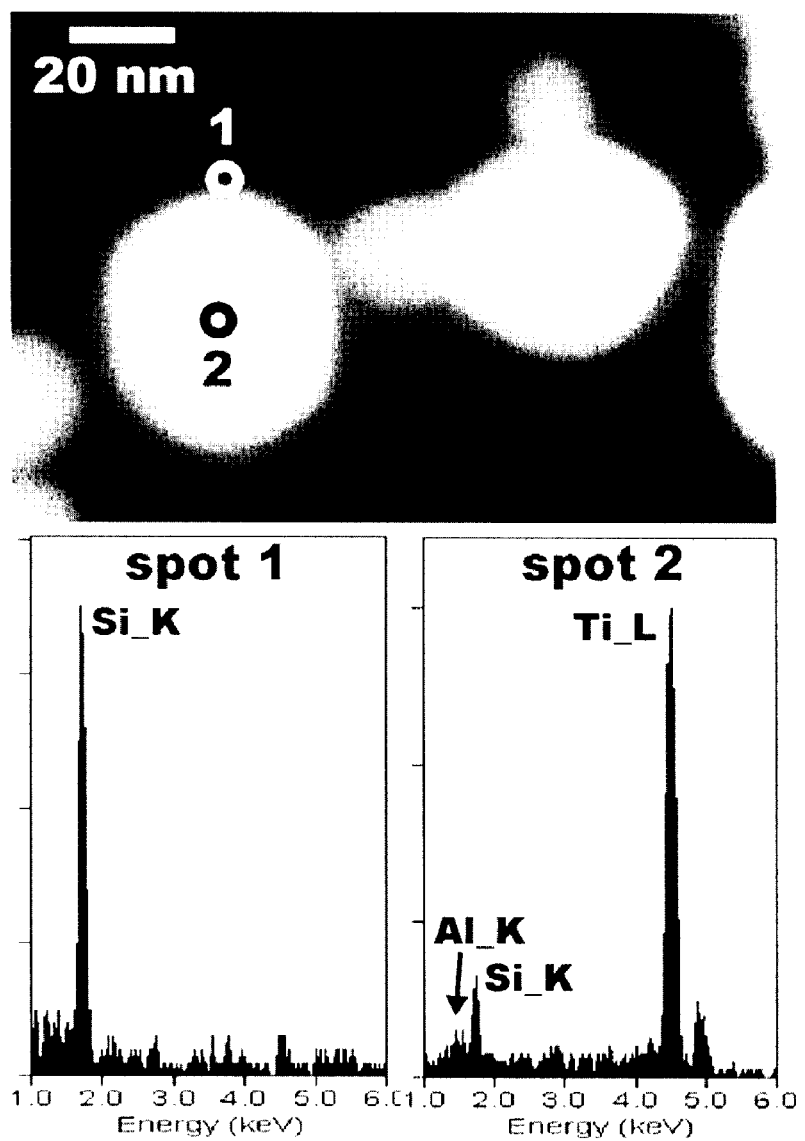
FIG. 4. High angle annular dark field detector (HAADF)-STEM image and energy-dispersive X-ray (EDX) spot analyses of 4Al/$TiO_2$ coated with 20 wt % $SiO_2$.

The 20Si/4Al/TiO$_2$ particle morphology (FIG. 2c) was further investigated by EDX analysis. In FIG. 4 the HAADF-STEM image and the corresponding Ti and Si spot analyses are shown. Because of atomic number (Z) contrast (Ti scatters stronger, i.e. appears brighter, than Si), the areas with silica at the rim of the particles appear significantly darker than the core regions comprising titania. Consequently, spot analysis of the dark region show only the signal of Si whereas spectra of the core show Ti as the main peak, a very small Al peak and a Si peak that is caused from the silica coating above and below the titania crystal.

Figure 5:
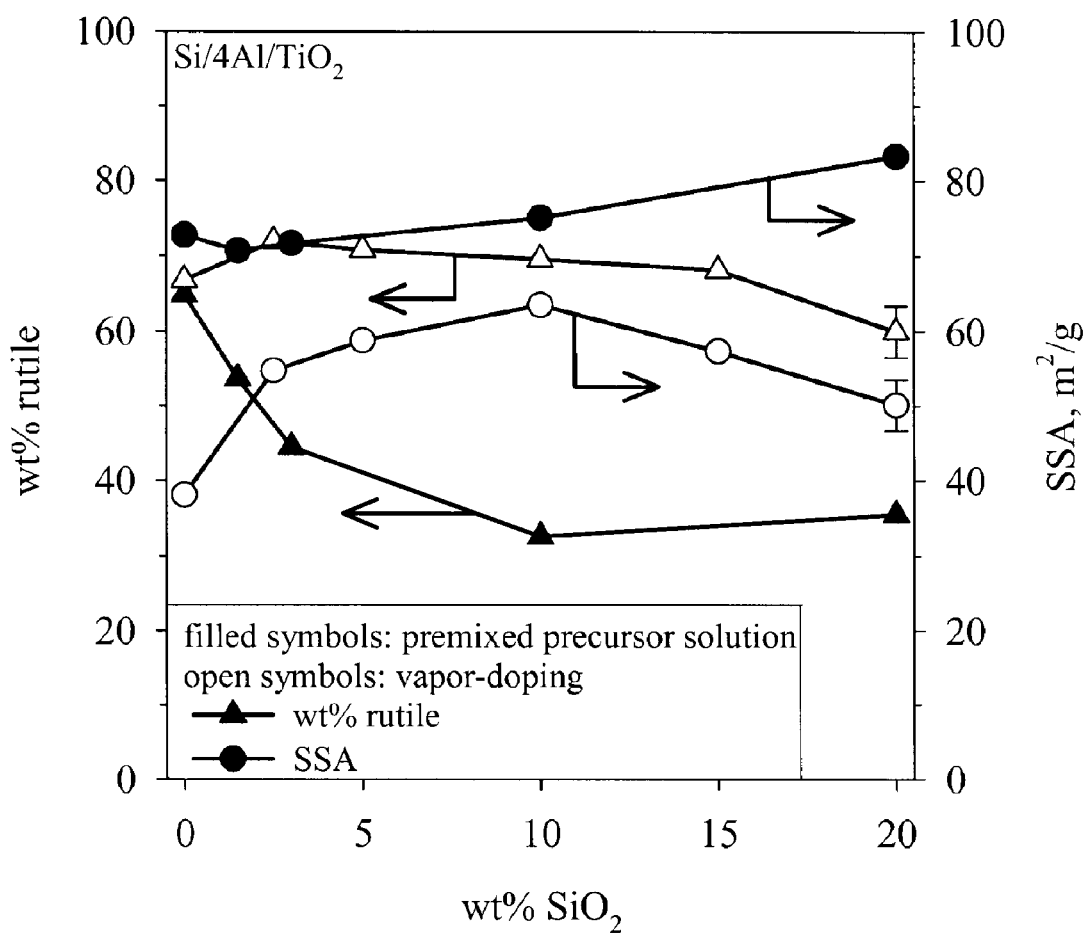
FIG. 5. Rutile weight fraction (left axis, triangles), specific surface area (SSA) (right axis, circles) as a function of $SiO_2$ content in Si/4Al/$TiO_2$ produced from premixed precursor solutions (filled symbols) and by vapor-doping (open symbols).

In FIG. 5 the rutile weight fraction (triangles, left axis) and SSA (circles, right axis) of Si/4Al/TiO$_2$ from premixed precursor solutions (filled symbols) or HMDSO vapor-coated (open symbols) are shown. For pure 4Al/TiO$_2$ the rutile content is nearly identical using the open or enclosed set-up, respectively. Notably, the rutile weight fraction decreases with increasing silica content as HMDSO is added to the FSP precursor solution (FIG. 5, filled triangles) where the silica precursor is introduced into the flame with TiCl$_4$. For example, already addition of 1.5 wt % SiO$_2$ reduces the rutile content from initial 65 to 54 wt % and further to 33 wt % at 10 wt % SiO$_2$. However, the anatase promotion of silica is counteracted by the presence of alumina compared to pure SiO$_2$/TiO$_2$, For 10Si/TiO$_2$ only 7 wt % rutile was obtained (not shown). In contrast, for the process of the present invention utilizing HMDSO vapor-coated 4Al/TiO$_2$ where the SiO$_2$ coating is achieved after the primary 4Al/TiO$_2$ particles have formed, the rutile content is nearly constant at 70 wt % up to 15 wt % SiO$_2$ and decreases to 60 wt % at 20 wt % SiO$_2$. Thus the anatase promotion of silica is significantly reduced by addition of HMDSO vapor after 4Al/TiO$_2$ particle formation in the flame.

Figure 6:
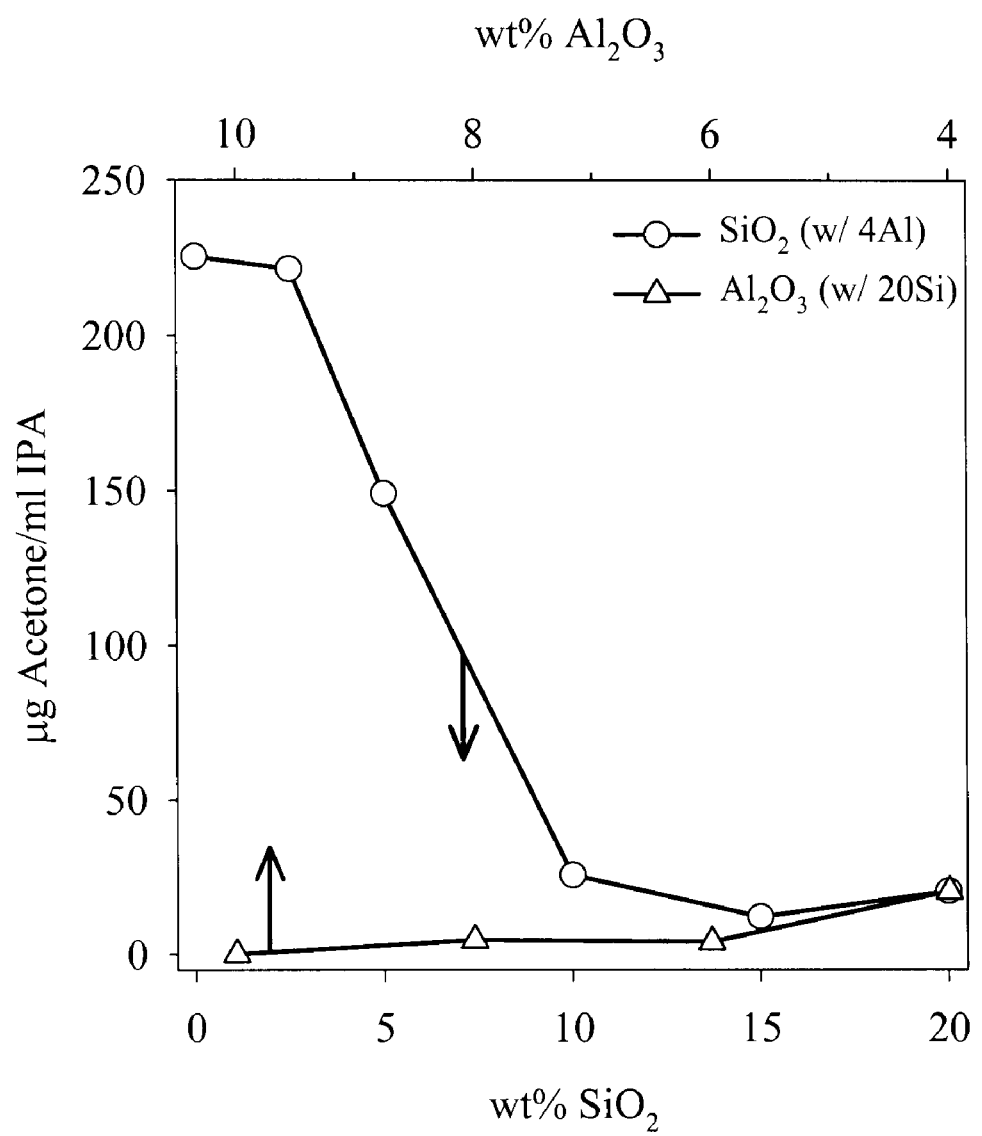
FIG. 6. Acetone concentration evolved during the photooxidation of isopropanol as a function of $SiO_2$ (circles, lower abscissa) and $Al_2O_3$ (triangles, upper abscissa) content.

FIG. 6 depicts micrograms (μg) of acetone evolving per milliliter (ml) of isopropyl alcohol (IPA) as a function of SiO$_2$ content in vapor-coated 4Al/TiO$_2$ particles (circles, lower abscissa). The amount of acetone formed from isopropyl alcohol is a measure of the photocatalytic activity of the coated TiO$_2$ nanoparticles. Pure 4Al/TiO$_2$ particles form 225 μg acetone. This remains rather constant at 2.5 wt % SiO$_2$, but is then rapidly reduced to 149 and 26 μg acetone by addition of 5 and 10 wt % SiO$_2$, respectively. At 2.5 wt % SiO$_2$ the coating should be rather thin (<0.5 nm, FIG. 3), and is thus not sufficient to hinder the photocatalytic activity of TiO$_2$. The coating thickness increases with increasing silica content (FIG. 3) and at 10 wt % coatings visible in TEM have formed (FIG. 2b). Further increasing the silica content to 15 and 20 wt % has rather little effect on the acetone formed (FIG. 6). This indicates that the coating thickness formed at 10 wt % SiO$_2$ is sufficient to inhibit the photocatalytic decomposition of IPA with TiO$_2$.

FIG. 6 also shows how the photocatalytic activity can be further reduced by increasing the alumina content in the core particles at constant silica content (triangles, upper abscissa). At 6 wt % Al$_2$O$_3$ only 4 μg acetone is evolving and a complete inhibition is achieved at 10 wt % Al$_2$O$_3$. Increasing the alumina content increases the rutile content of the particles, e.g. at 10 wt % Al$_2$O$_3$ the rutile content is 83 wt %. The lower photocatalytic activity of rutile compared to anatase titania has been reported in the literature (Allen et al., 2005).

Example 2

Effect of Ring-Burner-Height (RBH)

Figure 7:
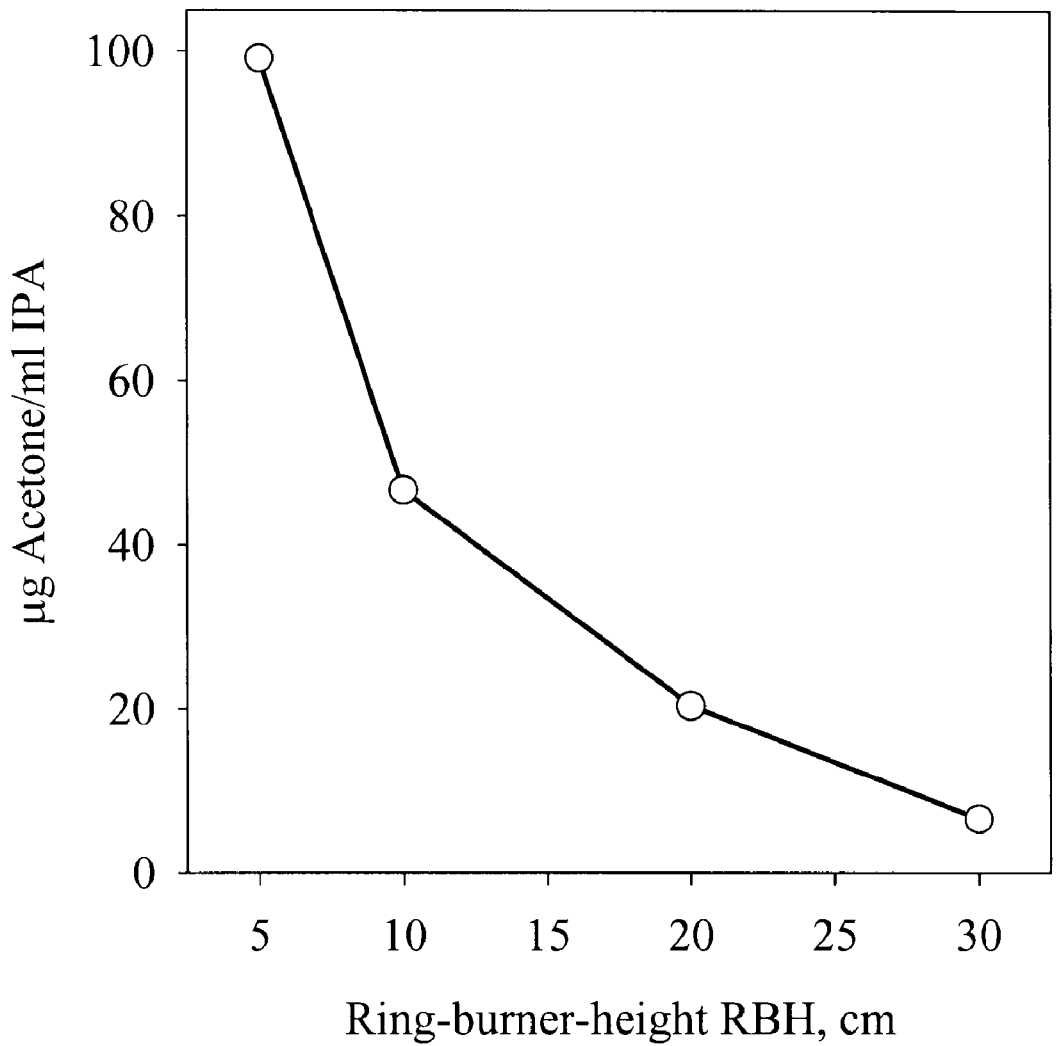
FIG. 7. Acetone concentration formed during the photooxidation of isopropanol as a function of RBH.

FIG. 7 shows the evolution of acetone as a function of RBH. The acetone formed decreases from 99 to 7 μg acetone as the RBH is increased from 5 to 30 cm, respectively. This is a result of the increasing rutile content as well as the formation of homogeneous SiO$_2$ coatings with increasing RBH.

REFERENCES

Akhtar, M. K., S. E. Pratsinis, and S. V. R. Mastrangelo, "Dopants in vapor-phase synthesis of titania powders," *J. Am. Ceram. Soc.* 75, 3408 (1992).

Akhtar, M. K., S. E. Pratsinis, and S. V. R. Mastrangelo, "Vapor-phase synthesis of Al-doped titania powders," *J. Mater. Res.* 9, 1241 (1994).

Allen, N. S., M. Edge, G. Sandoval, J. Verran, J. Stratton, and J. Maltby, "Photocatalytic coatings for environmental applications," *Photochem. Photobiol.* 81, 279 (2005).

Allen, N. S., H. Khatami, and F. Thompson, "Influence of titanium-dioxide pigments on the thermal and photochemical oxidation of low-density polyethylene film," *Eur. Polym. J.* 28, 817 (1992).

Beecroft, L. L., and C. K. Ober, "Nanocomposite materials for optical applications," *Chem. Mat.* 9, 1302 (1997).

Braun, J. H., "Titanium dioxide—A review," *J. Coat. Technol.* 69, 59 (1997).

Carotenuto, G., Y. S. Her, and E. Matijevic, "Preparation and characterization of nanocomposite thin films for optical devices," *Ind. Eng. Chem. Res.* 35, 2929 (1996).

Caseri, W. R., "Nanocomposites of polymers and inorganic particles: preparation, structure and properties," *Mater. Sci. Technol.* 22, 807 (2006).

Cheary, R. W., and A. A. Coelho, "Axial divergence in a conventional X-ray powder diffractometer. I. Theoretical foundations," *J. Appl. Crystallogr.* 31, 851 (1998).

Christensen, P. A., A. Dilks, T. A. Egerton, and J. Temperley, "Infrared spectroscopic evaluation of the photodegradation of paint—Part II: The effect of UV intensity & wavelength on the degradation of acrylic films pigmented with titanium dioxide," *J. Mater. Sci.* 35, 5353 (2000).

Egerton, T. A., "The modification of fine powders by inorganic coatings," *KONA* 16, 46 (1998).

El-Toni, A. M., S. Yin, and T. Sato, "Control of silica shell thickness and microporosity of titania-silica core-shell type nanoparticles to depress the photocatalytic activity of titania," *J. Colloid Interface Sci.* 300, 123 (2006).

Hung, C. H., and J. L. Katz, "Formation of mixed-oxide powders in flames 1. $TiO_2$—$SiO_2$," *J. Mater. Res.* 7, 1861 (1992).

Iler, R. K., Product comprising a skin of dense, hydrated amourphous silica bound upon a core of another solid material and process of making same, U.S. Pat. No. 2,885,366 (1959).

Kodas, T. T., Q. H. Powell, and B. Anderson, *Coating of $TiO_2$ pigment by gas-phase and surface reactions*, International patent, WO 96/36441 (1996).

Kyprianidou-Leodidou, T., P. Margraf, W. Caseri, U. W. Suter, and P. Walther, "Polymer sheets with a thin nanocomposite layer acting as a UV filter," *Polym. Adv. Technol.* 8, 505 (1997).

Lee, S. K., K. W. Chung, and S. G. Kim, "Preparation of various composite $TiO_2/SiO_2$ ultrafine particles by vapor-phase hydrolysis," *Aerosol Sci. Technol.* 36, 763 (2002).

Madler, L., H. K. Kammler, R. Mueller, and S. E. Pratsinis, "Controlled synthesis of nanostructured particles by flame spray pyrolysis," *J. Aerosol Sci.* 33, 369 (2002).

Madler, L., W. J. Stark, and S. E. Pratsinis, "Simultaneous deposition of Au nanoparticles during flame synthesis of $TiO_2$ and $SiO_2$," *J. Mater. Res.* 18, 115 (2003).

Mezey, E. J., "Pigments and Reinforcing Agents" in Vapor Deposition, eds. C. F. Powell, J. H. oxley and J. M. Blocher Jr., John Wiley & sons, New York (1966).

Nussbaumer, R. J., W. R. Caseri, P. Smith, and T. Tervoort, "Polymer-$TiO_2$ nanocomposites: A route towards visually transparent broadband UV filters and high refractive index materials," *Macromol. Mater. Eng.* 288, 44 (2003).

Piccolo, L., B. Calcagno, and E. Bossi, *Process for the post-treatment of titanium dioxide pigments*, U.S. Pat. No. 4,050,951 (1977).

Powell, Q. H., G. P. Fotou, T. T. Kodas, B. M. Anderson, and Y. X. Guo, "Gas-phase coating of $TiO_2$ with $SiO_2$ in a continuous flow hot-wall aerosol reactor," *J. Mater. Res.* 12, 552 (1997).

Schulz, H., L. Madler, R. Strobel, R. Jossen, S. E. Pratsinis, and T. Johannessen, "Independent control of metal cluster and ceramic particle characteristics during one-step synthesis of $Pt/TiO_2$," *J. Mater. Res.* 20, 2568 (2005).

Song, K. C., and S. E. Pratsinis, "Synthesis of bimodally porous titania powders by hydrolysis of titanium tetraisopropoxide," *J. Mater. Res.* 15, 2322 (2000).

Teleki, A., S. E. Pratsinis, K. Kalyanasundaram, and P. I. Gouma, "Sensing of organic vapors by flame-made $TiO_2$ nanoparticles," *Sens. Actuators, B, Chem* 119, 683 (2006).

Teleki, A., S. E. Pratsinis, K. Wegner, R. Jossen, and F. Krumeich, "Flame-coating of titania particles with silica," *J. Mater. Res.* 20, 1336 (2005).

Vemury, S., and S. E. Pratsinis, "Dopants in flame synthesis of titania," *J. Am. Ceram. Soc.* 78, 2984 (1995).

Wegner, K., and S. E. Pratsinis, "Nozzle-quenching process for controlled flame synthesis of titania nanoparticles," *AIChE J.* 49, 1667 (2003).

What is claimed is:

1. A method for the preparation of coated ultrafine titanium dioxide particles, the method comprising:
   (a) reacting a $TiO_2$ precursor with oxygen in a flame spray pyrolysis reactor to form ultrafine titanium dioxide particles in a $TiO_2$ formation zone of the flame spray pyrolysis reactor, the ultrafine titanium dioxide particles having an average particle size in a range of 1 nm to 100 nm; and
   (b) contacting the ultrafine titanium dioxide particles with a metal oxide precursor in a non-reactive carrier gas downstream of the $TiO_2$ formation zone at a point in the flame spray pyrolysis reactor where the temperature is less than about 900° C., to form coated ultrafine titanium dioxide particles having a smooth, homogeneous metal oxide coating.

2. The method of claim 1 further comprising isolating the coated ultrafine titanium dioxide particles.

3. The method of claim 1 wherein separate amorphous metal oxide particles are not formed from the metal oxide precursor.

4. The process of claim 1, wherein the $TiO_2$ precursor is selected from the group consisting of titanium halides and titanium alkoxides.

5. The process of claim 4, wherein the $TiO_2$ precursor is selected from the group consisting of $TiCl_4$, $TiCl_3$, titanium tetraisopropoxide, titanium tetraethoxide, and titanium tetrabutoxide.

6. The process of claim 1, wherein the coated ultrafine titanium dioxide particles are at least 95% by weight in the rutile form.

7. The process of claim 1, wherein the ultrafine titanium dioxide particles comprise aluminum oxide.

8. The process of claim 1, wherein the average particle size of the ultrafine titanium dioxide particles is between about 15 nm to about 80 nm.

9. The process of claim 1, wherein the average particle size of the ultrafine titanium dioxide particles is between about 15 nm to about 60 nm.

10. The process of claim 1, wherein the specific surface area of the ultrafine titanium dioxide particles is between about 15 m²/g to about 100 m²/g.

11. The process of claim 1, wherein the metal oxide coating comprises a metal oxide selected from the group consisting of $SiO_2$, $Al_2O_3$, $B_2O_3$, $ZrO_2$, $GeO_2$, $WO_3$, $Nb_2O_5$, MgO, ZnO, and $SnO_2$.

12. The process of claim 11, wherein the metal oxide is $SiO_2$.

13. The process of claim 11, wherein the metal oxide is $Al_2O_3$.

14. The process of claim 1, wherein the ultrafine titanium dioxide particles are contacted with the metal oxide precursor at a point downstream of the $TiO_2$ formation zone where at least 90% of the $TiO_2$ precursor has reacted with oxygen to the form ultrafine titanium dioxide particles.

15. The process of claim 1, wherein the ultrafine titanium dioxide particles are contacted with the metal oxide precursor at a point downstream of the $TiO_2$ formation zone where at least 95% of the $TiO_2$ precursor has reacted with oxygen to form the ultrafine titanium dioxide particles.

16. The process of claim 1, wherein the metal oxide precursor is selected from the group consisting of silicon halides, hexaalkyldisiloxanes, tetraalkylorthosilicates and silicon containing salts.

17. The process of claim 16, wherein the metal oxide precursor is hexamethyldisiloxane.

18. The process of claim 1, wherein the metal oxide coating has a thickness in a range of about 1 nm to about 10 nm.

19. The process of claim 1 wherein the metal oxide coating has a thickness in a range of about 2 nm to about 4 nm.

20. A method for the preparation of $SiO_2$-coated ultrafine titanium dioxide particles, the method comprising:
  (a) reacting a $TiO_2$ precursor with oxygen in a flame spray pyrolysis reactor to form ultrafine titanium dioxide particles in a $TiO_2$ formation zone of the flame spray pyrolysis reactor, the ultrafine titanium dioxide particles having an average particle size in a range of 1 nm to 100 nm; and
  (b) contacting the ultrafine titanium dioxide particles with a $SiO_2$ precursor in a non-reactive carrier gas downstream of the $TiO_2$ formation zone at a point in the flame spray pyrolysis reactor where the temperature is less than about 900° C., to form $SiO_2$-coated ultrafine titanium dioxide particles wherein the $SiO_2$ coating on the ultrafine titanium dioxide particles is smooth and homogeneous.

21. The method of claim 20 wherein separate amorphous $SiO_2$ particles are not formed from the $SiO_2$ precursor.

22. The process of claim 20, wherein the particle size of the ultrafine titanium dioxide particles is between about 15 nm to about 80 nm.

23. The process of claim 20, wherein the particle size of the ultrafine titanium dioxide particles is between about 15 nm to about 60 nm.

24. The process of claim 20, wherein the ultrafine titanium dioxide particles are contacted with the $SiO_2$ precursor at a point downstream of the $TiO_2$ formation zone where at least 95% of the $TiO_2$ precursor has reacted with oxygen to the form ultrafine titanium dioxide particles.

25. The process of claim 20, wherein the $SiO_2$ precursor is selected from the group consisting of silicon halides, hexaalkyldisiloxanes, tetraalkylorthosilicates and silicon containing salts.

26. The process of claim 25, wherein the $SiO_2$ precursor is hexamethyldisiloxane.

27. The process of claim 20 wherein the $SiO_2$ coating has a thickness in a range of about 2 nm to about 4 nm.

* * * * *